(12) United States Patent
Hayashi

(10) Patent No.: US 11,073,561 B2
(45) Date of Patent: Jul. 27, 2021

(54) INSULATION DETERIORATION DETECTION DEVICE FOR ELECTRIC MOTOR

(71) Applicant: OKUMA Corporation, Aichi (JP)

(72) Inventor: Yasukazu Hayashi, Aichi (JP)

(73) Assignee: OKUMA CORPORATION, Aichi (JP)

( * ) Notice: Subject to any disclaimer, the term of this patent is extended or adjusted under 35 U.S.C. 154(b) by 60 days.

(21) Appl. No.: 16/298,237

(22) Filed: Mar. 11, 2019

(65) Prior Publication Data

US 2019/0285698 A1 Sep. 19, 2019

(30) Foreign Application Priority Data

Mar. 14, 2018 (JP) .............................. JP2018-046289

(51) Int. Cl.
| | |
|---|---|
| *G01R 31/34* | (2020.01) |
| *G01R 31/52* | (2020.01) |
| *G01R 31/12* | (2020.01) |

(52) U.S. Cl.
CPC ....... *G01R 31/346* (2013.01); *G01R 31/1272* (2013.01); *G01R 31/343* (2013.01); *G01R 31/52* (2020.01); *H02K 2211/00* (2013.01)

(58) Field of Classification Search
None
See application file for complete search history.

(56) References Cited

U.S. PATENT DOCUMENTS

| 2006/0158197 A1* | 7/2006 | Horikoshi ............ G01R 31/343 324/551 |
| 2008/0197855 A1* | 8/2008 | Uchida .............. G01R 31/1263 324/509 |
| 2009/0134881 A1* | 5/2009 | Tachizaki .............. B60L 3/0023 324/551 |
| 2011/0320146 A1* | 12/2011 | Watanabe .......... G01R 31/1227 702/65 |
| 2013/0147491 A1* | 6/2013 | Kawamura ............ G01R 31/52 324/509 |

FOREIGN PATENT DOCUMENTS

| JP | 05328739 A | 12/1993 |
| JP | 2006226993 A | 8/2006 |

* cited by examiner

*Primary Examiner* — Nasima Monsur
(74) *Attorney, Agent, or Firm* — Cantor Colburn LLP

(57) ABSTRACT

An insulation deterioration detection device which is mounted in an inverter device including a plurality of switching elements includes: a frequency component extractor which extracts the same frequency component as a frequency of the three-phase alternating current power from the current detection signal of an electric motor winding wire connected to the switching element; and an insulation deterioration detection controller which performs a first switching operation for turning on the switching element and turning off the other switching elements and stores in a first storage device the frequency component extracted by the frequency component extractor during an execution period of the first switching operation, in which it is determined whether insulation deterioration of the electric motor occurs at least based on a value stored in the first storage device.

3 Claims, 2 Drawing Sheets

INSULATION DETERIORATION DETECTION DEVICE FOR ELECTRIC MOTOR

CROSS REFERENCE TO RELATED APPLICATION

The present application claims priority under 35 U.S.C. § 119 to Japanese Patent Application No. 2018-046289 filed on Mar. 14, 2018, which is incorporated herein by reference in its entirety including the specification, claims, drawings, and abstract.

TECHNICAL FIELD

The present invention relates to an insulation deterioration detection device for an electric motor which is mounted in an inverter device for performing current control of the electric motor.

BACKGROUND

Conventional examples of an insulation deterioration detection device which is mounted in an inverter device for performing current control of an electric motor are disclosed in JP HS-328739A and in JP 2006-226993A. In a method of detecting a ground fault as disclosed in JP HS-328739A, a current detector or a switching element such as a transistor which is used for current control is used as an insulation deterioration detection device, which enables addition of the insulation deterioration detection device to the inverter device at low cost. However, in the method of detecting the insulation deterioration (ground fault) disclosed in JP HS-328739A, since a detection level required for the current control of the current detector is a large current from several tens of amperes to several hundreds of amperes, and a noise level is several tens of mA, the insulation deterioration detection device can detect the abnormalities only when the insulation deterioration is considerably worsened.

In recent years, an earth leakage breaker is often installed to a power supply of the inverter device. Since the earth leakage breaker shuts off a power supply when current of 15 to 30 mA leaks, in the method of detecting the insulation deterioration (ground fault) disclosed in JP HS-328739A, it is difficult to detect the abnormality of insulation deterioration before the earth leakage breaker shuts off the power supply.

In contrast, in the insulation deterioration detection device disclosed in JP 2006-226993A, since a current detector and switching elements dedicated to the leakage current are mounted separately in the inverter device, it is easy to detect the insulation deterioration of the electric motor earlier than the earth leakage breaker. However, since an expensive component dedicated to the insulation deterioration is mounted in the inverter device, it is difficult to mount this insulation deterioration detection device in the inverter device as standard.

Note that in a machine tool, it is assumed that when the power supply is shut off by an earth leakage breaker or the like during processing due to current leakage of the electric motor, the workpiece is damaged, which may cause considerable damage infrequently. Therefore, it is preferable to detect the insulation deterioration before the workpiece is processed. However, such a situation occurs infrequently, and a similar situation may occur due to power failure such as during a lightning strike. Therefore, only a limited number of users wish to mount the insulation deterioration detection device in the inverter device at added cost.

The present specification discloses a low-cost insulation deterioration detection device which can detect insulation deterioration of an electric motor before an earth leakage breaker shuts off a power supply.

SUMMARY

An insulation deterioration detection device disclosed in the present specification is mounted in an inverter device which includes a DC power supply which converts a three-phase alternating current power in which one phase is grounded into DC power, a current detector which detects a current flowing in a winding wire of an electric motor to output the detected current as a current detection signal, and a plurality of switching elements which are bridge-connected to the DC power supply, the insulation deterioration detection device includes a frequency component extractor which extracts the same frequency component as a frequency of the three-phase alternating current power from the current detection signal of an electric motor winding wire connected to the switching element, and an insulation deterioration detection controller which performs a first switching operation for turning on the switching element and turning off the other switching elements and stores the frequency component extracted by the frequency component extractor during an execution period of the first switching operation in a first storage device, in which a determination is made as to whether insulation deterioration of the electric motor occurs based on at least a value stored in the first storage device.

In this case, the insulation deterioration detection controller further performs a second switching operation for turning off all of the plurality of switching elements during the same period as the execution period of the first switching operation, and stores the frequency component extracted by the frequency component extractor during an execution period of the second switching operation in a second storage device, in which a determination is made as to whether the insulation deterioration occurs based on a difference value between a value stored in the first storage device and a value stored in the second storage device.

The frequency component extractor includes a sine wave signal generator which generates a sine wave signal having the same phase as a phase voltage of one phase which is grounded, based on three-phase line voltage of the three-phase alternating current power, and the frequency component extractor may extract the same frequency component as a frequency of the three-phase alternating current power based on a sine wave signal generated by the sine wave signal generator.

ADVANTAGEOUS EFFECTS OF INVENTION

The insulation deterioration detection device disclosed in the present specification can detect insulation deterioration of an electric motor before an earth leakage breaker shuts off a power supply and is of low cost.

BRIEF DESCRIPTION OF DRAWINGS

Embodiment(s) of the present disclosure will be described by reference to the following figures, wherein.

DESCRIPTION OF EMBODIMENTS

Figure 3:
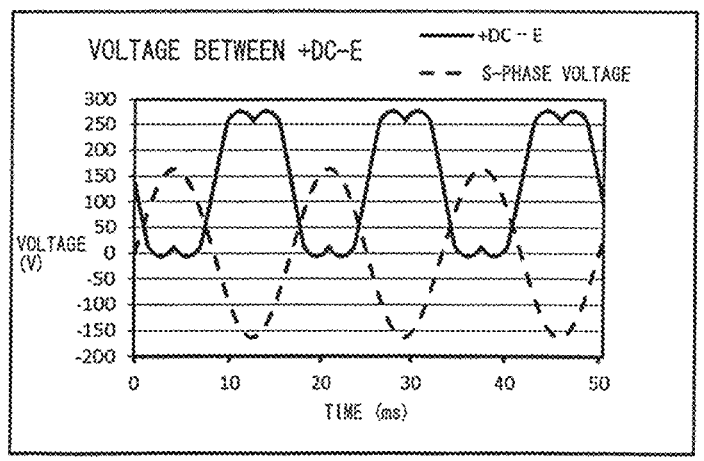
FIG. 3 is a graph showing a voltage waveform between +DC and E when an S phase is grounded.

Firstly, there will be described an insulation deterioration detection principle of an insulation deterioration detection device disclosed in the present specification. In the case of a typical DC power supply in which an S phase is grounded, the DC power supply converts a three-phase alternating current power with a voltage of 200 V and a frequency of 60 Hz into DC power, and a voltage (+DC-E) indicated by a solid line in FIG. 3 is applied between an upper arm (+DC) of the DC power supply and the earth (E). When a switching element Qx connected to an upper arm side is turned on in a state in which the insulation deterioration occurs in an electric motor, a leakage current having a waveform approximately proportional to the voltage (+DC-E) indicated by a solid line in FIG. 3 flows between the electric motor winding wire connected to the switching element Qx and the earth. Therefore, the waveform components as indicated by the solid line in FIG. 3 are contained in a current detection signal output by a current detector for winding wire through which the leakage current has flowed. The waveform as indicated by the solid line in FIG. 3 contains a DC component, a frequency component of 60 Hz of a three-phase alternating current, and its third harmonic component. Regarding the DC component, it is difficult to distinguish from an offset voltage of the current detector, and the lower the frequency, the greater the variation due to 1/f noise of an amplifier or the like affects, which is not suited for detecting a minute leakage current. Regarding the third harmonic component, the amplitude level is about 60% of the amplitude level of a fundamental wave component. The insulation deterioration detection device disclosed in the present specification performs a first switching operation to turn on only one or more switching elements Qx connected to the upper arm side, extracts, during the execution period of this first switching operation, the leakage current component which is the same frequency component as the frequency of the three-phase alternating current from the current detection signal of the current flowing in the winding wire connected to the switching elements Qx, and stores the extracted leakage current component in a first storage device. Then, the insulation deterioration detection device detects whether the insulation deterioration occurs based on the magnitude of the frequency component stored in the first storage device. According to this detection technique, since the same frequency component as the frequency of the three-phase alternating current is extracted, the detection is less likely to be affected by the offset of the current detector and the noise. This enables a minute leakage current amount (amount of insulation deterioration) to be detected with high accuracy.

The current detection signal contains noise of the current detector unrelated to the current actually flowing in the winding wire. The extracted leakage current component (the same frequency component as the frequency of the three-phase alternating current) also contains the same frequency component (noise component) as the frequency of the three-phase alternating current which is contained in this noise. The insulation deterioration detection device disclosed in the present specification performs a second switching operation to turn off all of the switching elements for the same period of time as that during which the switching elements Qx are turned on (the execution time of the first switching operation), and stores, in a second storage device, the frequency component extracted by the frequency component extractor during the execution period of this second switching operation. A value of the frequency component stored in this second storage device becomes closer to a value of the same frequency component as the frequency of the three-phase alternating current which is contained in the noise of the current detector. Therefore, the leakage current component in which the effect of noise is reduced can be accurately obtained by obtaining a difference value between the value stored in the first storage device and the value stored in the second storage device. Detecting the leakage current amount (insulation deterioration amount) based on this difference value enables highly accurate detection of the leakage current amount (insulation deterioration amount).

A current detector or a switching element such as a transistor which is used for current control is used as the insulation deterioration detection device disclosed in the present specification, and the other processing is performed by the software of a microcomputer mounted in the inverter device. Since the software processing required for the insulation deterioration detection can be performed before starting or after completing control of the current flowing in the winding wire of the electric motor, the software processing does not affect the control processing of the electric motor. Accordingly, no cost increase is required to increase processing performance of the microcomputer. With the reasons described above, it is easy to mount the insulation deterioration detection device in the inverter device in which a typical existing microcomputer is mounted, without adding hardware. Thus, it is possible to mount the insulation deterioration detection device disclosed in the present specification as standard in the existing inverter device, without an increase in costs.

Figure 1:
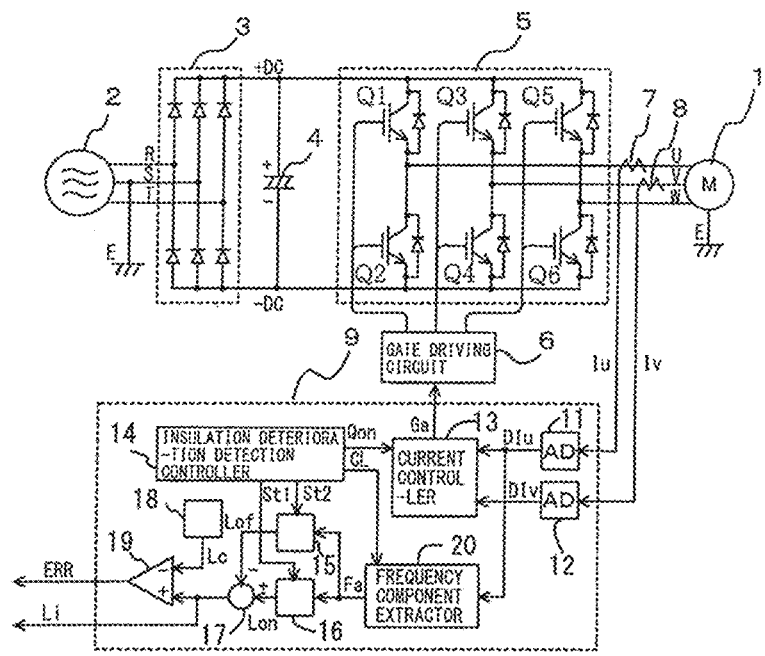
FIG. 1 is a block diagram illustrating an inverter device in which an insulation deterioration detection device is mounted.
Figure 2:
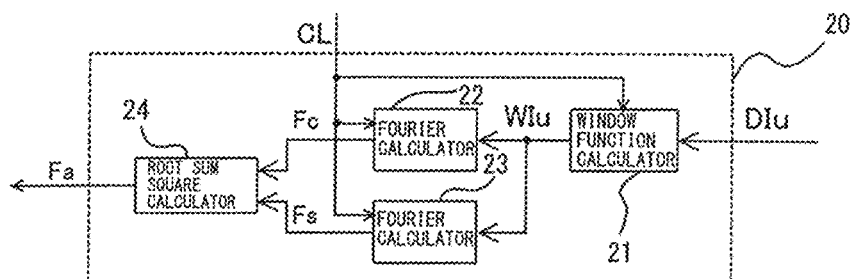
FIG. 2 is a block diagram illustrating a frequency component extractor of FIG. 1.

Next, specific embodiments will be described with reference to the drawings. FIG. 1 is a block diagram illustrating an inverter device in which an insulation deterioration detection device is mounted. FIG. 2 is a block diagram illustrating a frequency component extractor in FIG. 1. A three-phase alternating current power supply 2 in which an R phase, an S phase, and a T phase are shifted by 120 degrees from one another outputs a line voltage of 200 V having a frequency of 60 Hz, and the S phase is connected (grounded) to earth (E). A diode module 3 contains six diodes, in which the three-phase powers from the three-phase alternating current power supply 2 are converted into the DC powers of +DC and −DC. An electrolytic capacitor 4 is connected between +DC and −DC, and smooths a pulsation component contained in a DC voltage. A transistor module 5 includes three sets of switching elements; i.e., switching elements Q1 and Q2, switching elements Q3 and Q4, and switching elements Q5 and Q6 which are bridge-connected. The three sets of switching elements output three-phase currents of a U phase, a V phase, and a W phase to an electric motor 1, respectively. Current detectors 7, 8 detect the currents of the U-phase and V-phase, respectively, the detected currents of the U-phase and V-phase are input to AD converters 11, 12, as detection signals Iu, Iv, respectively, and the detection signals Iu, Iv are converted into digital signals DIu, DIv, respectively. The digital signals DIu, DIv are input to a current controller 13, and the current controller 13 controls each of the detection signals Iu, Iv to be the same as a current command amount, by controlling turning on and off the switching elements Q1, Q2, Q3, Q4, Q5, Q6 through a gate driving circuit 6 in accordance with the current command.

An insulation deterioration detection controller 14 outputs, to the current controller 13, a first switching operation command Qon for turning on only one element of the switching element Q1 and turning off the other five elements through the current controller 13 in the first part (0.5 seconds) (integer cycle time of the frequency of the three-phase alternating current power supply 2) of about one second immediately before the inverter device starts the current control or immediately after the inverter device ends the current control. Furthermore, the insulation deterioration detection controller 14 outputs an initialization command CL to a frequency component extractor 20 immediately before the switching element Q1 is turned on.

When the initialization command CL is input to the frequency component extractor 20, the frequency component extractor 20 initializes the internal variables t indicating times of a window function calculator 21, and Fourier calculators 22, 23 to zero, and clears integrators in the Fourier calculators 22, 23. The window function calculator 21 calculates the formula DIu×(0.5−0.5 COS (2πt/0.5)). The window function calculator 21 performs a hanning window function operation for 0.5 seconds on the digital signal DIu, and outputs a signal WIu. The window function processed signal WIu is input to the Fourier calculators 22, 23. The Fourier calculator 22 calculates the formula WIu×COS (2πft) where f=60, and integrates the calculation results for each 1 ms to output a signal Fc. The Fourier calculator 23 calculates the formula WIu×SIN (2πft), and accumulates the calculation results for each 1 ms to output a signal Fs. Thus, the Fourier calculators 22, 23 output the values proportional to a cosine component and a sine component as the signals Fc, Fs, respectively, 0.5 seconds after the initialization command CL is input to the frequency component extractor 20, the cosine component and the sine component having a frequency of 60 Hz which are contained in 0.5 seconds of the detection current Iu. A root sum square calculator 24 performs the operation of SQRT (Fc$^2$+Fs$^2$) on the signal Fc and the signal Fs to output a signal Fa.

A first storage device 16 stores the signal Fa in accordance with a storage command St1 output from the insulation deterioration detection controller 14 at the timing when the switching element Q1 is switched from on to off (start timing of the first switching operation). Then, the insulation deterioration detection controller 14 outputs, to the current controller 13, a second switching operation command Qon to turn off all of the switching elements Q1, Q2, Q3, Q4, Q5, Q6. The insulation deterioration detection controller 14 outputs the initialization command CL at the start timing of this second switching operation, and outputs a storage command St2 to a second storage device 15 0.5 seconds thereafter, so that the signal Fa is stored in the second storage device 15. Thus, a signal Fof stored in the second storage device 15 becomes a value proportional to a component of a frequency 60 Hz which is contained in 0.5 seconds of the detection current Iu when the motor winding wire is disconnected, and becomes a value proportional to a component of a frequency 60 Hz of the noise output from the current detector 7. A signal Fon stored in the first storage device 16 becomes a value proportional to a component of a frequency 60 Hz which is contained in 0.5 seconds of the detection current Iu when the voltage indicated by the solid line in FIG. 3 is applied between the motor winding wire and the earth for 30 cycles, and becomes a value proportional to a leakage current amount which contains the noise component of the current detector 7. A subtractor 17 outputs, to the outside, a signal Li obtained by subtracting the signal Fof from the signal Fon. A comparator 19 compares the signal Li with a numerical value Lc which is set in advance and stored in a third storage device 18, and outputs a signal ERR indicating the abnormality to the outside when the signal Li is larger than the numerical value Lc. Note that the processing in a block surrounded by a dashed line 9 is performed by hardware and software mounted in the microcomputer.

The insulation deterioration detection device of FIG. 1 may output the signal Fon without being processed as the signal Li when the noise component contained in the detection signal Iu of the current detector 7 is sufficiently small. However, when the noise contained in the detection signal Iu contains a large amount of the same frequency component as the alternating current power supply, erroneous detection of the leakage current can be prevented by subtracting the signal Fof proportional to the noise component. Note that the frequency component extractor 20 cannot be applied to an alternating current power supply having a frequency other than the frequency 60 Hz as it is. Therefore, it is necessary to change the setting of a variable f to the frequency of the alternating current power supply when the inverter device is installed.

Figure 4:
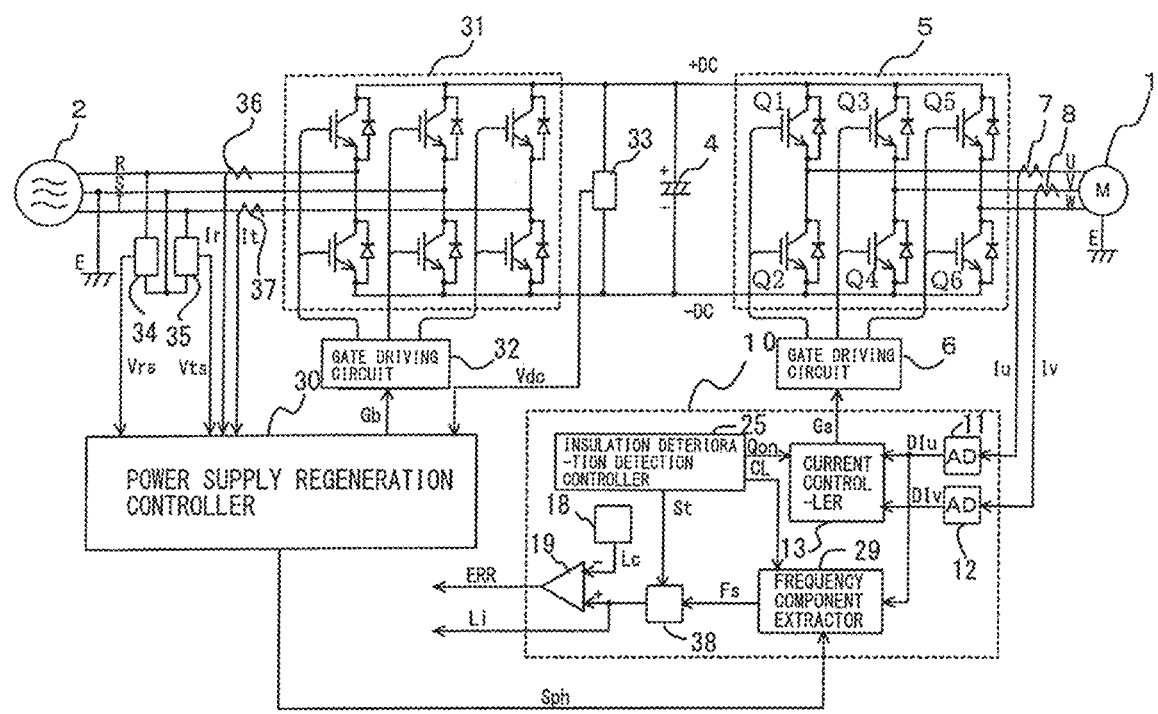
FIG. 4 is a block diagram illustrating an inverter device in which the other insulation deterioration detection device is mounted.
Figure 5:
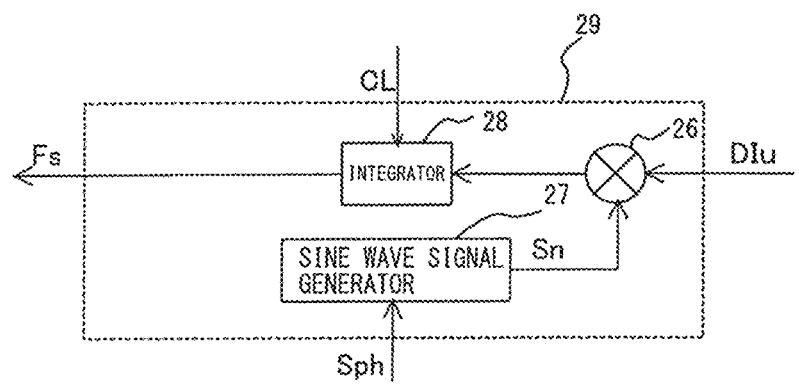
FIG. 5 is a block diagram illustrating a frequency component extractor of FIG. 4.

FIG. 4 is a block diagram illustrating the inverter device in which the other insulation deterioration detection device is mounted. FIG. 5 is a block diagram illustrating a frequency component extractor 29 of FIG. 4. In FIG. 4, the same reference numerals as in FIG. 1 are assigned to the components having the corresponding functions and operations in FIG. 1, and the description thereof is omitted. Voltage detectors 34, 35 output line voltages between the R phase and the S phase and between the T phase and the S phase of the three-phase alternating current power supply 2 as detection signals Vrs, Vts, respectively. Current detectors 36, 37 output currents flowing in the R phase and the T phase as the detection signals Ir, It, respectively. A voltage detector 33 outputs a voltage between +DC and −DC of a direct current power supply as a detection signal Vdc. A transistor module 31 includes six switching elements, and converts three-phase power from the three-phase alternating current power supply 2 into direct currents of +DC and −DC.

The detection signals Vdc, Vrs, Vts, Ir, It are input to a power supply regeneration controller 30. The power supply regeneration controller 30 controls turning on and off of the six switching elements which are included in the transistor module 31 through a gate driving circuit 32 when the detection signal Vdc exceeds a preset value, to return the regeneration power generated when the rotation of the electric motor 1 is decelerated to the three-phase alternating current power supply 2, thereby controlling to suppress the increase in DC power supply voltage. The power supply regeneration controller 30 identifies the frequency and phase of the phase voltage of the S phase which is grounded based on the detection signals Vrs and Vts, and outputs its information as a serial signal Sph to the frequency component extractor 29. In the frequency component extractor 29, a sine wave signal generator 27 outputs a sine wave signal Sn fully synchronized with a reverse phase of the S-phase voltage based on the information on the serial signal Sph. A multiplier 26 calculates the formula DIu×Sn, and an integrator 28 integrates the calculation results for each 1 ms to output a signal Fs. The insulation deterioration detection controller 25 outputs, to the current controller 13, a first switching operation command Qon for turning on only one element of the switching element Q1 and turning off the other five elements through the current controller 13 during 60 cycles of the sine wave signal Sn immediately before the inverter device starts the current control or immediately after the inverter device ends the current control. Furthermore, the insulation deterioration detection controller 25 outputs an initialization command CL to a frequency component extractor 29 immediately before the switching element Q1 is turned on (when the first switching operation is started), to clear the integrator 28. The insulation deterioration detection controller 25 inputs an storage command St to a first storage device 38 at the timing when the switching element Q1 is switched from on to off, to store the signal Fs.

With these operations, a signal Li stored in the first storage device 38 becomes a value proportional to a component amount of a frequency 60 Hz which is contained in one second of the detection current Iu when the voltage indicated by the solid line in FIG. 3 is applied between the motor winding wire and the earth for 60 cycles. Since in the frequency component extractor 29, the calculation process equivalent to the Fourier transformation is performed using a signal Sn fully synchronized with the S-phase, the window function operation and the root sum square operation are not necessary, and the influence of the noise contained in the detection signal Iu of the current detector 7 can be reduced.

When the DC power supply having the power supply regeneration function is applied as illustrated in FIG. 4, an interphase voltage detector of the three-phase alternating current power supply is mounted as standard, and therefore it is unnecessary to add new hardware. In the embodiment of FIG. 4, it is unnecessary to set the frequency in advance according to a difference in an alternating-current frequency. Note that in FIG. 5, the sine wave signal generator 27 transmits the voltage phase of the S phase which is grounded, but may input a signal corresponding to the signal Sn to the frequency component extractor by performing the calculating processing of the detection signals Vrs, Vts, the signal corresponding to the signal Sn being directly generated as a sine wave signal on the power supply regeneration control side.

In the specific embodiments in FIG. 1 and FIG. 4, only one switching element Q1 is turned on based on the first switching operation command, but two or more switching elements may be turned on. For example, the two elements of the switching elements Q1 and Q3 may be turned on based on the first switching element command so that the sum DIu+DIv of the detection currents DIu, DIv flowing in the winding wires which are connected to the switching elements Q1 and Q3, respectively is input to the frequency component extractor. When the currents of the three phases can be detected, all of the switching elements which are connected to either one of the upper arm and the lower arm may be turned on.

REFERENCE SIGNS LIST

1 Electric motor,
2 Three-phase alternating current power supply,
3 Diode module,
4 Electrolytic capacitor,
5, 31 Transistor module,
6, 32 Gate driving circuit,
7, 8, 36, 37 Current detector,
9, 10 Microcomputer,
11, 12 AD converter,
13 Current controller,
14, 25 Insulation deterioration detection controller,
15 Second storage device,
16, 38 First storage device,
17 Third storage device,
18 Subtractor,
19 Comparator,
20, 29 Frequency component extractor,
21 Window function calculator,
22, 23 Fourier calculator,
24 Root sum square calculator,
26 Multiplier,
27 Sine wave signal generator,
28 Integrator,
33, 34, 35 Voltage detector

The invention claimed is:

1. A system comprising an inverter device and an insulation deterioration detection device which is mounted in the inverter device,
wherein the inverter device comprises:
a DC power supply which converts a three-phase alternating current power in which one phase is grounded into a DC power;
a current detector which detects a current flowing in a winding wire of an electric motor to output the detected current as a current detection signal; and
a plurality of switching elements which are bridge-connected to the DC power supply, and which switch the DC power to the three-phase alternating current power by being turned on and off,
the insulation deterioration detection device comprises:
a frequency component extractor which extracts the same frequency component as a frequency of the three-phase alternating current power from the current detection signal of an electric motor winding wire connected to one of the switching element; and
an insulation deterioration detection controller which performs a first switching operation for turning on the one of the switching element and turning off the other switching elements and stores in a first storage device the frequency component extracted by the frequency component extractor during an execution period of the first switching operation,
wherein it is determined whether insulation deterioration of the electric motor occurs at least based on a value stored in the first storage device.

2. The system according to claim 1, wherein
the insulation deterioration detection controller further performs a second switching operation for turning off all of the plurality of switching elements during the same period as the execution period of the first switching operation, and stores in a second storage device the frequency component extracted by the frequency component extractor during an execution period of the second switching operation,
wherein it is determined whether the insulation deterioration occurs based on a difference value between a value stored in the first storage device and a value stored in the second storage device.

3. The system according to claim 1, wherein
the frequency component extractor includes a sine wave signal generator which generates a sine wave signal having the same phase as a phase voltage of one phase which is grounded, based on three-phase line voltage of the three-phase alternating current power, and
the frequency component extractor extracts the same frequency component as a frequency of the three-phase alternating current power based on a sine wave signal generated by the sine wave signal generator.

* * * * *